United States Patent [19]
Ikeda et al.

[11] Patent Number: 6,143,077
[45] Date of Patent: *Nov. 7, 2000

[54] CHEMICAL VAPOR DEPOSITION APPARATUS

[75] Inventors: Kei Ikeda; Akiko Kobayashi, both of Tokyo, Japan

[73] Assignee: Anelva Corporation, Fuchu, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/905,766

[22] Filed: Aug. 4, 1997

[30] Foreign Application Priority Data

Aug. 13, 1996 [JP] Japan .................................. 8-231513

[51] Int. Cl.⁷ .................................................. C23C 16/00
[52] U.S. Cl. ........................... 118/715; 118/724; 118/725; 118/726
[58] Field of Search .................................. 118/715, 724, 118/725, 726

[56] References Cited

U.S. PATENT DOCUMENTS

| | | | |
|---|---|---|---|
| 4,825,809 | 5/1989 | Mieno ..................................... | 118/725 |
| 4,854,263 | 8/1989 | Chang et al. ........................... | 118/715 |
| 5,108,792 | 4/1992 | Anderson et al. ...................... | 118/725 |
| 5,200,232 | 4/1993 | Tappan et al. .......................... | 118/725 |
| 5,264,040 | 11/1993 | Geyling .................................. | 118/728 |
| 5,536,319 | 7/1996 | Wary et al. ............................. | 118/726 |

FOREIGN PATENT DOCUMENTS 61-193453  8/1986  Japan ...................................... 118/726

OTHER PUBLICATIONS

High Purification of Cu Thin Films by Oxygen Addition . . . ; 1995 Dry Process Symposium; A. Kajita, H. Kaneko et al.; pp. 123–128.
Advanced Metalization and Interconnect Systems For Ulsi Applications; Oct. 1–3, 1996 Boston, Massachusetts, pp. 54–55.
The Deposition Rate Cu–CVD with Cu(hfac)(tmvs) A. Kobayashi et al.; presented Jan. 10, 1997.
Three–dimensional Equipment Modeling . . . ; J. Vac. Sci.Tech. A14(3); May/Jun. 1996.

*Primary Examiner*—Stanley S. Silverman
*Assistant Examiner*—Michael P. Colaianni
*Attorney, Agent, or Firm*—Burns, Doane, Swecker & Mathis, LLP

[57] ABSTRACT

A source gas delivery system 4 which delivers the source gas to the surface of the heated substrate 20 is furnished with a gas delivery guide 44 of a shape such that the distance from the substrate 20 becomes narrower either gradually on in steps from the edge of the gas delivery port 443 on the same axis as the substrate 20 toward the outer edge, and delivers the source gas in such a way that the thickness distribution of the boundary layer which is the region in the vicinity of the surface of the substrate 20 where the velocity of the flow of source gas along the surface of the substrate is essentially zero is almost constant or gradually becomes narrower in the direction of the flow.

7 Claims, 10 Drawing Sheets

CHEMICAL VAPOR DEPOSITION APPARATUS

BACKGROUND OF THE INVENTION

1. Field of the Invention

The present invention relates to chemical vapor deposition apparatus with which thin films are deposited using chemical reactions of a reactive gas.

2. Related Art

A process whereby appropriate thin films are deposited on the surface of a substrate is required in the production of large scale integrated circuits (LSI) and liquid crystal displays (LCD). The use of a chemical vapor deposition (CVD) apparatus with which a thin film is deposited using chemical reactions of a reactive gas is common in thin film deposition processing, since it is possible to select the composition ratio of the thin film quite freely. A front outline view of a conventional chemical vapor deposition apparatus of this type is shown in FIG. 10. The CVD apparatus shown in FIG. 10 is furnished with a reactor 1 which is provided with a pumping system 11, a substrate holder 2 which supports the substrate 20 which is to be processed at a prescribed location within the reactor 1, a heater 3 with which said substrate 20 is heated to a set temperature and a source gas delivery system 4 which delivers a source gas to the surface of the heated substrate 20. A thin film is deposited on the surface of the substrate 20 using chemical reactions on or near said surface.

Much research has been carried out recently in connection with MOCVD (metal organic chemical vapor deposition) in which an organometallic compound which is liquid at normal temperature and pressure is used as the precursor for the deposition of metals. For example, in the field of metal materials for wiring purposes, copper (Cu) which has a low specific resistance with a high electro-migration resistance is regarded as being of significance as a wiring material of the next generation. Organometallic compounds which are liquid at normal temperature and pressure, such as copper (trimethylvinylsilyl)hexafluoroacetylacetonate (referred to hereinafter as Ch(hfac)(tmvs)), are used as the precursor.

A source gas delivery system for a liquid precursor of this type is illustrated in FIG. 10. The source gas delivery system 4 comprises the precursor reservoir 41 in which the liquid-state precursor is stored, the vaporizer 42 which vaporizes the liquid-state precursor, the gas delivery pipe 421 which supplies the vaporized source gas to the reactor 1 and the valve 422 which is fitted thereto, and a mass flow controller which is not shown in the drawing. The shower head 43 which is established inside the reactor 1 is connected to the end of the gas delivery pipe 421.

The shower head 43 is a disk-shaped part with an internal space which is connected to the gas delivery pipe 421. This shower head 43 has a large number of gas discharge holes 430 in the front surface which faces the substrate 20 which is being supported on the substrate holder 2. The source gas is blown out from the gas discharge holes 430 and enters the reactor 1.

A carrier gas delivery system 5, which introduces the carrier gas which is mixed with the source gas, is connected to the source gas delivery system 4 in order to introduce the source gas into the reactor 1 efficiently. The substrate holder 2 incorporates the heater 3 for heating the substrate 20 to the set temperature for bringing about chemical reactions on the surface of the substrate 20. The heater 12, which prevents liquefaction of the source gas, is established around the outer wall of the reactor 1.

The operation of the conventional chemical vapor deposition apparatus described above is explained by means of an example of the CVD deposition of copper using Cu(hfac)(tmvs) as the precursor. The substrate 20 is supported (clamped) onto the substrate holder 2 and the substrate 20 is heated to some 100 to 300° C. by means of the heater 3. The Cu(hfac)(tmvs) is vaporized in the vaporizer 42.

The vaporized Cu(hfac)(tmvs) which has been mixed with hydrogen as a carrier gas is blown out from the gas discharge holes 430 of the shower head 43 and introduced into the reactor 1. The introduced Cu(hfac)(tmvs) gas reaches the substrate 20 and a film of Cu accumulates on the surface of the substrate 20 as a result of a series of chemical reactions including a degradation reaction which is caused by heat.

The source gas can be delivered uniformly to the whole surface of the substrate 20 by adjusting the arrangement of the gas discharge holes 430 of the shower head 43. The shower head 43 is one which is good in terms of the uniformity of the film thickness distribution and the uniformity of the film quality distribution (film quality characteristics distribution).

With conventional CVD apparatus of the type described above, increasing the deposition rate is of importance for increasing productivity. The deposition rate depends on the rate limiting conditions of the chemical reaction which results in the thin film. In general, at temperatures above a certain level, the rate of the chemical reaction is dominated by the delivery rate (mass-transfer limited rate determining process) and so the film growth rate is determined by the delivery rate of the precursor. Hence, with a chemical reaction, the rate of which is determined by the delivery rate, it is important that as much source gas as possible is delivered to the substrate surface as a precursor.

When the sufficient precursor is supplied at the substrate surface, the deposition rate is dominated by the surface reaction. In the case of Langmuir reaction type, when the partial pressure of the precursor at the substrate surface increase, the gap-filling property improve.

In those cases where a precursor which is a liquid at normal temperature and pressure is being used, the delivery rate of the source gas depends to a large extent on the vaporization efficiency of the vaporizer 42. The main factor which determines the vaporization efficiency is the pressure within the vaporizer 42. The vaporization efficiency is high when the pressure is low but it falls as the pressure increases.

With the conventional CVD deposition apparatus described above, the gas is blown out from the shower head 43 through the small discharge holes 430 and so the pressure inside the shower head 43 must inevitably rise. The interior of the vaporizer 42, which is on the upstream side of the shower head 43, is at an even higher pressure. Hence, it is difficult with conventional CVD apparatus in which a shower head 43 is used to increase the vaporization efficiency of the vaporizer 42. As a result, it is difficult to increase the deposition rate because the delivery rate of the precursor cannot be increased.

The pressure is raised where the gas flow flux is concentrated in the parts where the flow-way is small, such as in each of the gas discharge holes 430 of the shower head 43. As a result, the source gas may liquify. If the source gas liquifies then the reproducibility of the delivery rate of the source gas is poor and stable deposition becomes impossible. Furthermore, the gas discharge holes 430 become smaller due to the attachment of the liquified source gas and this results in a viscous circle and the pressure is increased even more. In the worst case, the gas discharge holes 430 may become blocked. Blockage of this type has the effect of rendering the delivery rate of source gas from each of the gas discharge holes 430 irregular.

Moreover, there is a further problem with the CVD apparatus shown in FIG. 10 in that a film, for example a Cu film, is liable to be deposited on the inside and outside of the shower head 43, and this is liable to become a source of dust contamination. The shower head 43 which has the gas discharge holes 430 has a large surface area on which a film can be deposited and, moreover, there are many corners at which film deposition may start.

The apparatus shown in FIG. 11 makes use of a cap-shaped gas delivery guide 44 instead of the shower head 43 shown in FIG. 10. The gas delivery guide 44 comprises a circular base plate part 441 and the side plate part 442 which is established around the edge of the base plate part 441 extending toward the substrate 20. The internal diameter of the side plate part 442 is a little larger than the diameter of the substrate 20. An opening 443 (referred to hereinafter as the gas delivery port) is established in the center of the base plate part 441 which is located on the same axis as the center of the substrate 20. The end of the gas delivery pipe 421 is connected to this gas delivery port 443. The construction is otherwise essentially the same as that shown in FIG. 10.

The gas delivery guide 44 shown in FIG. 11 introduces gas into the reactor 1 from a single gas delivery port 443 which is established in the center. The gas delivery port 443 is quite large when compared with a single gas delivery hole 430 of the shower head 43 shown in FIG. 10. Hence, the pressure in the pipe 421 from the vaporizer 42 to the reactor 1 can be somewhat lower than that in the apparatus shown in FIG. 10. Consequently, when compared with the apparatus shown in FIG. 10, a lower pressure can be maintained in the vaporizer, the vaporization efficiency can be held at a higher level, and the deposition rate is increased by the rise in the delivery efficiency of the source gas.

However, although the deposition rate was increased when deposition was carried out in practice using the apparatus shown in FIG. 11, the film thickness distribution was not uniform. A nonuniform film thickness distribution appeared with a tendency for the film thickness in the outer parts to be lower than the film thickness in the middle part of the substrate 20. This is a result of the nonuniformity of the thickness distribution of the boundary layer of fluid dynamics at the surface of the substrate 20. This is explained below with reference to FIGS. 12(a) and 12(b), hereinafter referred to as FIG. 12.

FIGS. 12(a) and 12(b) are diagrams which show the flow of source gas on the surface of the substrate in the apparatus shown in FIG. 11. When operating the apparatus shown in FIG. 11, the source gas 40 which has been mixed with the carrier gas flows in from the gas delivery port 443 toward the substrate 20. The source gas 40 flows on the surface of the substrate 20 so as to spread out from the center of the substrate 20 over a range of 360° in the form of a laminar flow, and reaches the outer edge of the substrate 20.

Consider in detail the state of the gas flow at the surface of the substrate 20. The flow of source gas 40 along the surface of the substrate 20 is a macro-laminar flow due to the difference between the pressures in the vaporizer 42 and the gas delivery pipe 421 and in the reactor 1.

As shown in FIGS. 12(a) and 12(b), the flow rate at the surface of the substrate 20 is physically zero. Moreover, the flow rate is also almost zero in the region very close to the surface. In the region very close to the surface of the substrate 20 the macro-flow of the source gas 40 is almost nonexistent. The movement of source gas in this region is dominated by the "diffusion" of fluid dynamics due to thermal motion. The region 401 in the vicinity of the substrate where the source gas 40 moves mainly as diffusion is a region located between the substrate 20, which is a static solid (solid bulk), and the laminar gas flow region 402 where the source gas 40 is a fluid. This region is called the boundary layer 401 following the terminology of fluid dynamics.

Efficient delivery of the source gas 40 to the surface of the substrate 20 is important for depositing a film by chemical vapor deposition, as described above. The source gas 40 is delivered for the thermo-chemical reaction which occurs at the surface of the substrate 20 mainly by diffusion, as described above. The thickness of the boundary layer 401 has an effect on the delivery of the source gas 40 by diffusion. In those cases where the boundary layer 401 is thin, the surface of the substrate 20 is reached quickly by diffusion transfer across a thin cross section of the boundary layer 401. Hence, the delivery efficiency of the source gas 40 to the surface of the substrate is increased and the deposition rate is increased.

The source gas cannot reach the surface of the substrate 20 without travelling a long distance in those cases where the boundary layer 401 is thick. The delivery efficiency of the source gas 40 is reduced and the deposition rate is also reduced. In other words, if the thickness of the boundary layer 401 is uniform then the deposition rate on the surface of the substrate 20 is also uniform, and the film thickness distribution of the deposited thin film is also uniform.

The deposition rate and the film characteristics are important deposition characteristics, and control of the rate of the surface reaction (which is to say the conditions) is necessary for improving the latter.

An adequate supply is necessary to make the surface reaction rate limiting and, even if the flow rate is increased, if the boundary layer thickness is increased then diffusion control predominates and the deposition characteristics are not good. In order to eliminate this it is necessary to achieve an adequate supply rate (an adequate concentration in the vicinity of the boundary layer) and to keep the boundary layer below a certain thickness.

The fact that the film thickness is greater in the middle part of the substrate and thin in the outer parts of the substrate with film deposition using the apparatus shown in FIG. 11 is thought to be based on the phenomenon outlined above. In the middle part of the substrate, close to the gas delivery port 443, the effect due to the flow of source gas 40 is considerable and the boundary layer 401 is thin. In the outer edge part the effect of the flow of the source gas 40 is reduced since these parts are far removed from the gas delivery port and the boundary layer 401 is thicker. The nonuniform film thickness described above arises as a result of this situation.

This trend is the same in cases where the difference in pressure in the vaporizer 42 and the gas delivery pipe 421 and in the reactor 1 is large and the rate of flow of gas from the gas delivery port 443 is high. Even if the flow rate from the gas delivery port 443 is high, the boundary layer 401 in the center of the substrate simply becomes thinner, and the nonuniform thickness of the boundary layer 401 in the middle part of the substrate and outer part of the substrate cannot be eliminated.

OBJECTS AND SUMMARY

The invention of this application is intended to provide chemical vapor deposition apparatus with which the film thickness distribution is made uniform by delivering the source gas to the whole surface of the substrate uniformly and with good efficiency.

It is an object of the present invention to provide a chemical vapor deposition (CVD) apparatus in which no shower head is used.

It is another object of the present invention to provide a source gas delivery system of a chemical vapor deposition apparatus that delivers a source gas in such a way that the source gas flows in a laminar flow along the surface of the substrate and delivers the source gas in such a way that the thickness distribution of the boundary layer which is formed on the substrate surface in the flow of source gas is more or less constant, or becomes thinner gradually in the direction of the flow.

One embodiment of such a chemical vapor deposition apparatus has a reactor which is furnished with a pumping system, a substrate holder on which the substrate is held within the reactor, a heater which heats said substrate to the set temperature and a source gas delivery system which delivers the source gas to the surface of the heated substrate. This chemical vapor deposition apparatus deposits a thin film which has a uniform film thickness distribution on the substrate surface using chemical reactions at the surface, or in the vicinity of the surface, of the substrate.

The source gas delivery system in this embodiment has a gas delivery guide which is arranged in the reactor in such a way as to face the substrate which has been clamped on the substrate holder. The gas delivery guide has a shape such that its distance from the substrate becomes smaller either gradually or in steps on proceeding from the edge of the gas delivery port to the outer edge of the guide. This gas delivery guide has the gas delivery port in the center and is arranged in a position where the center axis of this gas delivery port is on the same axis as the center of the substrate. Moreover, the gas delivery pipe is connected to the gas delivery port.

Preferably, the surface of the gas delivery guide which faces the substrate has a shape which has an inclined surface of a circular cone on the same axis as the center of the substrate.

Preferably, the surface of the gas delivery guide which faces the substrate is a hyperboloid of revolution obtained on rotating about a rotation axis on the same axis as the center of the substrate, a hyperbola where, when the distance from the center axis on said surface is r and the distance between said surface and the substrate is h, the product of r and h is more or less constant, irrespective of the size of r.

Preferably, the surface of the gas delivery guide which faces the substrate is a curved surface of rotation obtained on rotating about a rotation axis on the same axis as the center of the substrate a curve where, when the distance from the center axis on said surface is r and the distance between said surface and the substrate is h, the product of r and h becomes smaller as r increases.

Moreover, the size of the surface of the gas delivery guide which faces the substrate is preferably greater than the surface of the substrate.

Furthermore, the gas delivery guide preferably has established a temperature controlling mechanism such that no thin film accumulates on its surface.

The chemical vapor deposition apparatus is preferably furnished with a vaporizer which vaporizes the precursor when the source gas delivery system uses a precursor which is a liquid at normal temperature and pressure.

DETAILED DESCRIPTION OF THE PREFERRED EMBODIMENTS

Figure 1:
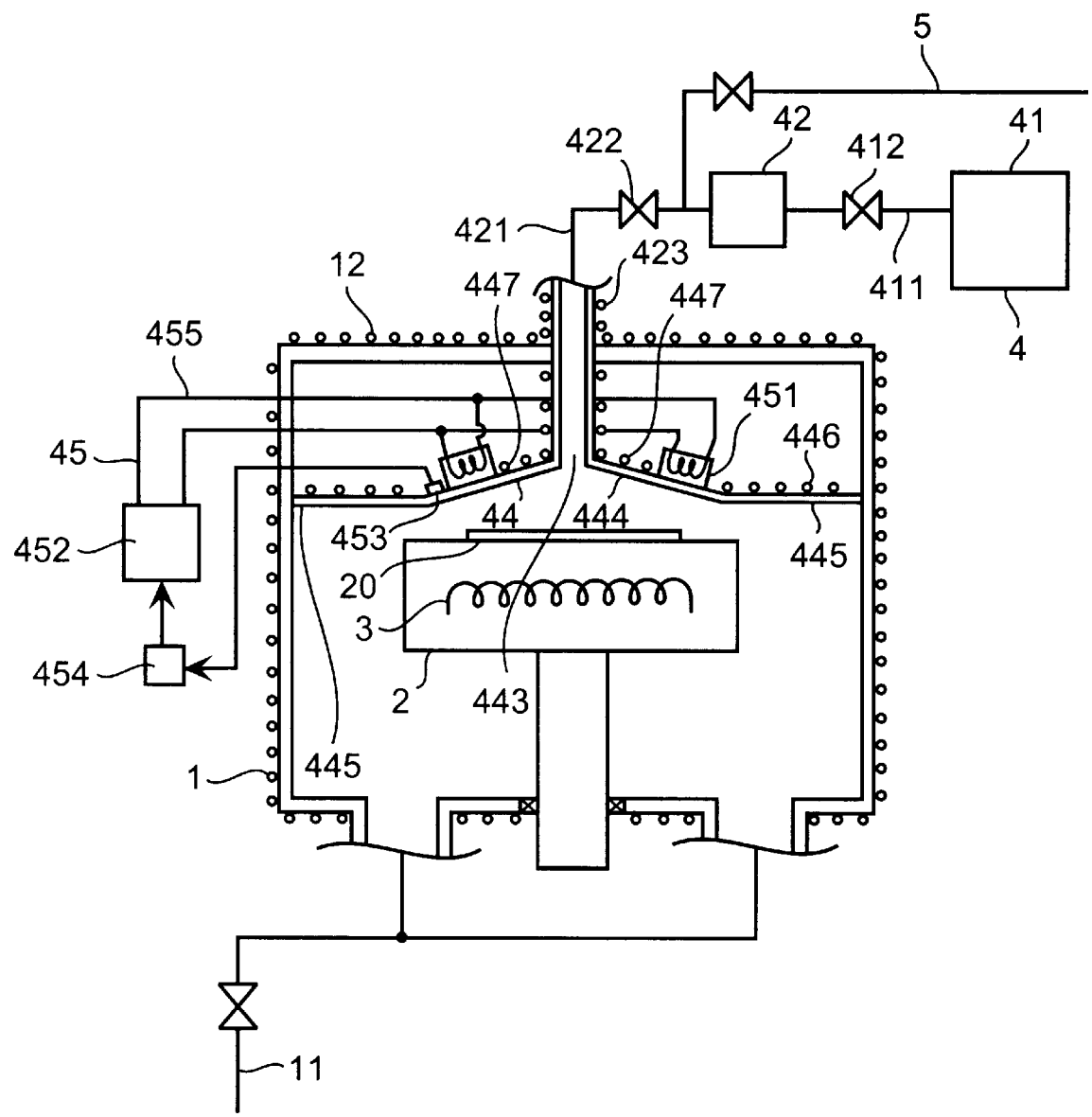
FIG. 1 is a front outline view which shows one embodiment of chemical vapor deposition apparatus of the invention of this application.
Figure 2:
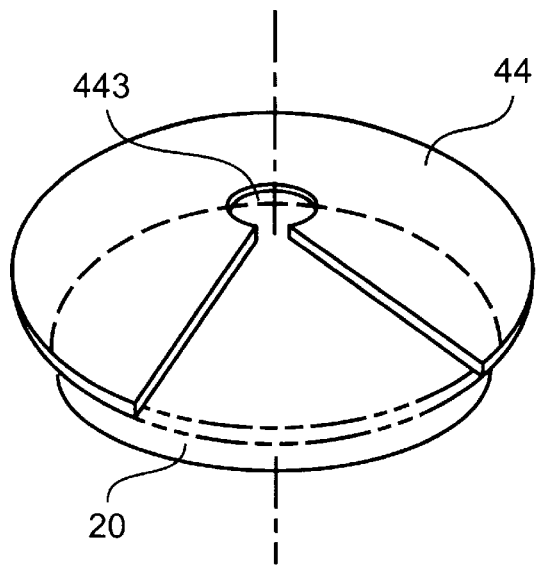
FIG. 2 is an oblique outline view which shows the gas delivery guide used in the apparatus of FIG. 1.
Figure 3:
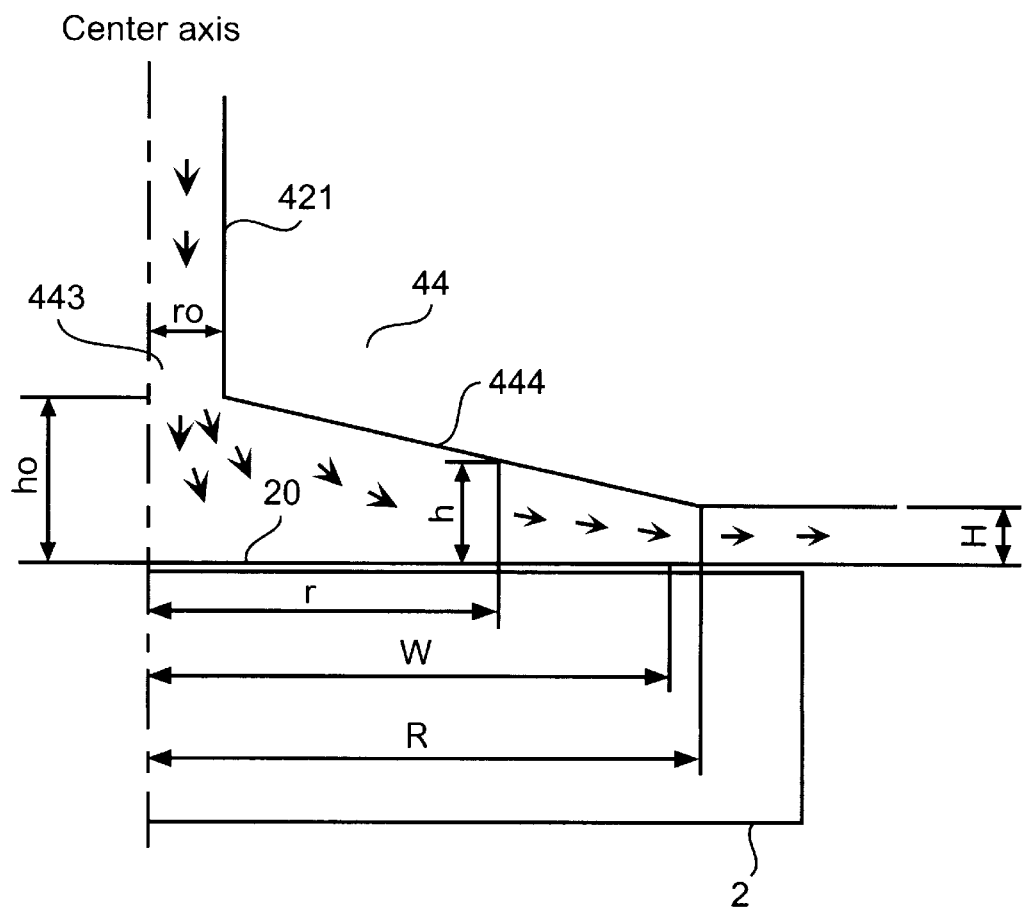
FIG. 3 is a diagram which shows the flow of source gas in the gas delivery guide used in the apparatus of FIG. 1.

FIG. 1 is a front outline view of chemical vapor deposition (CVD) apparatus according to one embodiment of the present invention. FIG. 2 is an oblique outline view of the gas delivery guide used in the apparatus of FIG. 1, and FIG. 3 is a diagram which shows the flow of source gas in the gas delivery guide used in the apparatus of FIG. 1.

The CVD apparatus shown in FIG. 1 is furnished with the reactor 1 which is provided with a pumping system 11, a substrate holder 2 on which the substrate 20 is held (clamped), a heater 3 which heats said substrate 20 to the set temperature, and a source gas delivery system 4 which delivers source gas to the surface of the heated substrate 20. With the apparatus shown in FIG. 1, a thin film is deposited on the substrate surface by means of thermal CVD where chemical reactions of the source gas are caused to occur due to the heat of the substrate 20.

The reactor 1 is a gas-tight container which is furnished with a gate valve which is not shown in the drawings. The heater 12 is established on the outer wall surface of the reactor 1. This heater 12 heats the reactor 1 so that the source gas which is delivered by the source gas delivery system 4 does not condense on the inner walls of the reactor 1. The pumping system 11, which is furnished with a vacuum pump such as an oil diffusion pump or a turbo molecular pump, evacuates the interior of the reactor 1 to a pressure of not more than $1\times10^{-2}$ Pa.

The substrate holder 2 has a substrate 20 mounted and clamped on its upper surface. The substrate holder 2 has an electrostatic chuck mechanism which is not shown in the drawings with which the substrate 20 is attracted by electrostatic means established as required. A commercial resistance heat generating system, such as a cartridge heater 3, is established within the substrate holder 2. The heater 3 heats the substrate 20 to the temperature required to produce the chemical reactions for CVD. This temperature is within the range from 150° to 250°.

The apparatus of this embodiment makes use of a precursor which is a liquid at normal temperature and pressure. The source gas delivery system 4 vaporizes the liquid precursor and delivers it to the substrate 20. In practical terms, the source gas delivery system 4 comprises the precursor reservoir 41 in which the precursor, which is a liquid, is stored, the vaporizer 42 which vaporizes the liquid precursor, the gas delivery pipe 421 which conducts the vaporized precursor into the reactor 1, and the gas delivery guide 44 which is connected to the end of the gas delivery pipe 421.

A valve 412 and flow controller, which is not shown in the drawing, are established in the liquid feed pipe 411 which links the precursor reservoir 41 and the vaporizer 42. The vaporizer 42 vaporizes the precursor, sometimes by heating a gas-tight container into which the liquid precursor has been introduced, sometimes by evacuating the space within the container and reducing the pressure, sometimes by bubbling the liquid precursor with an agitator or sometimes by a combination of such means.

A valve 422 and a gas mass flow controller not shown in the drawing, are established in the gas delivery pipe 421 between the vaporizer 42 and the reactor 1. The heater 423 which heats the pipe 421 is fitted to the gas delivery pipe 421, and the temperature of the gas delivery pipe 421 is set to such a temperature that liquefaction of the source gas is prevented.

The gas delivery guide 44 which is a major distinguishing feature of the CVD apparatus of this embodiment has a gas delivery port 443 on the same axis as the center of the substrate 20. As in the case of the CVD apparatus shown in FIG. 11, the end of the gas delivery pipe 421 is connected to the gas delivery port 443. As shown in FIGS. 2 and 3, the gas delivery guide 44 in this embodiment has a shape where the surface facing the substrate 20 (referred to hereinafter 25 as the opposing surface) 444 has a circular conical form on the same axis as the center of the substrate 20. As is clear from FIGS. 2 and 3, the overall shape of the gas delivery guide 44 in this embodiment may be represented more forcefully as being a "funnel" or a "horn".

The gas delivery guide 44 which may be formed from a metal such as stainless steel or aluminum may have an alumite treated surface. There are also cases where a gas delivery guide 44 which is made of quartz is used. The gas delivery guide 44 is fitted in the reactor 1 by means of a fitting part 445 which extends parallel with the substrate 20 from the outer edge of the opposing surface 444. The fitting part 445 is also provided with a heater 446 in order to prevent liquefaction of the source gas.

The gas delivery guide 44 in this embodiment has the form of a funnel or horn as described above and so the distance between the opposing surface 444 and the substrate 20 gradually becomes smaller on proceeding from the edge of the gas delivery port 443 to the outer edge.

Figure 11:
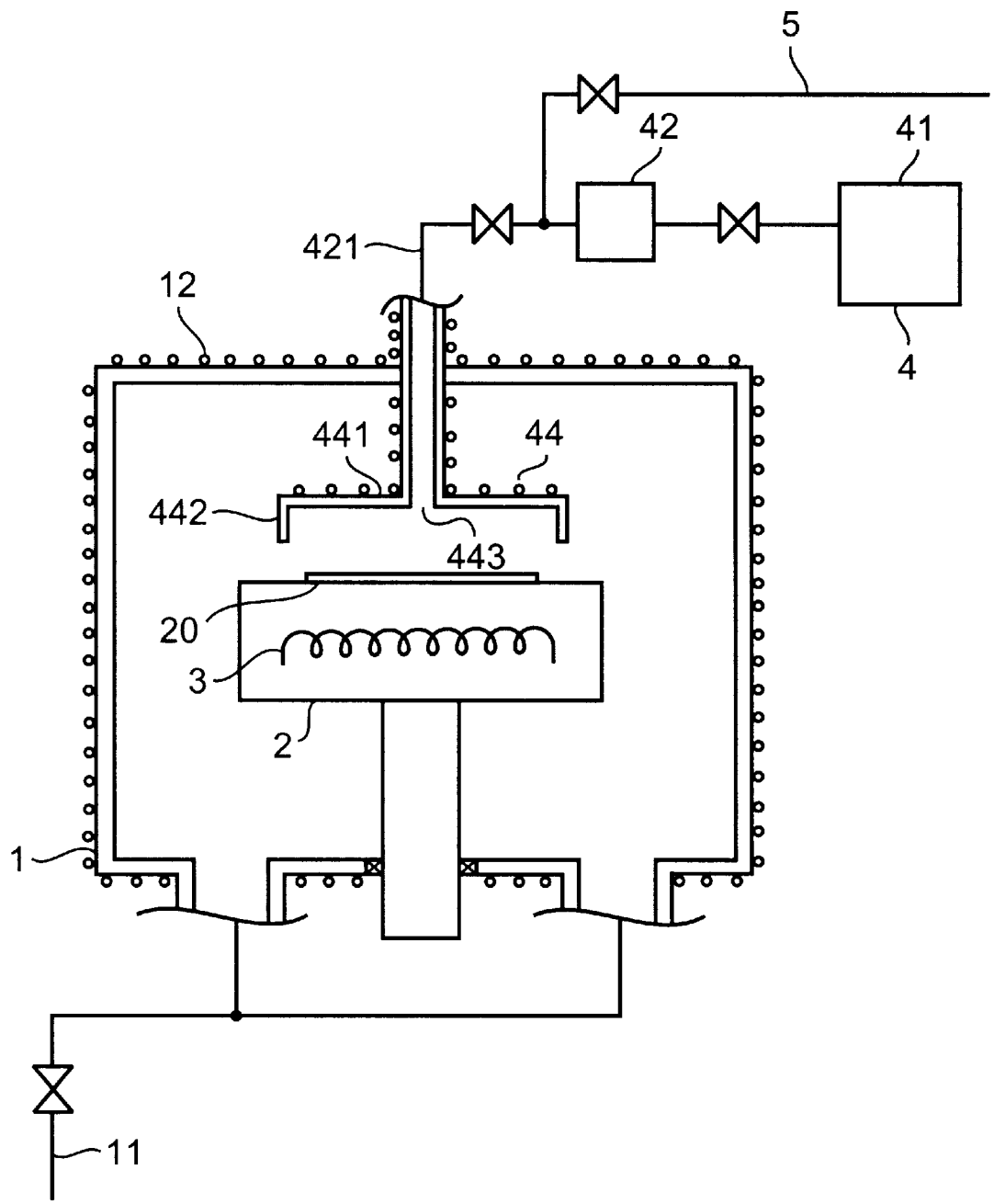
FIG. 11 is a front outline view which shows other conventional chemical vapor deposition apparatus.
Figure 12A:
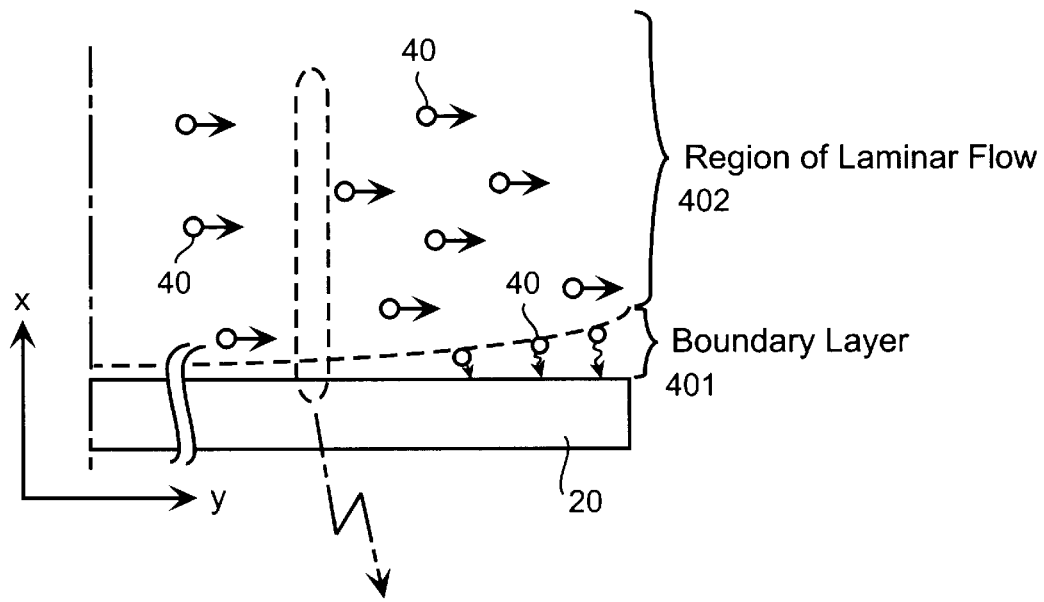
FIGS. 12(a) and 12(b) are diagrams which show the state of supply of source gas to the surface of the substrate in the chemical vapor deposition apparatus of FIG. 11.
Figure 12B:
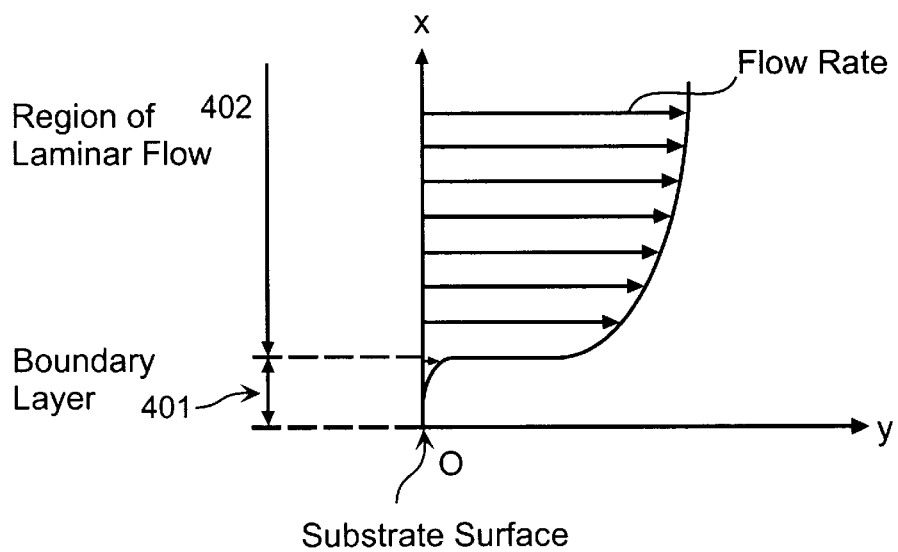

As described earlier, when the source gas flows along the surface of the substrate 20 in the CVD apparatus shown in FIG. 11, the boundary layer becomes thicker at the outer edge than in the center of the substrate 20 and, as a result, a nonuniformity in that the film thickness becomes thinner at the outer edge of the substrate 20 arises. The structure of the gas delivery guide 44 of the embodiment described in FIG. 1 reduces the distance from the substrate 20, which is to say the gas flow way, on proceeding toward the outer edge in order to eliminate this weakness.

In general, the thickness of the boundary layer depends on the flow rate in the laminar flow gas flow region ($\delta = k \ast v^{-\frac{1}{2}}$, where $\delta$ is the thickness of the boundary layer, v is the gas flow velocity and k is a constant). The flow velocity is inversely proportional to the cross sectional area of the flow way. If the pressure difference between the ends of the flow way is constant then the flow velocity increases as the cross sectional area of the flow way becomes smaller, and the thickness of the boundary layer is reduced.

With the conventional gas delivery guide 44 shown in FIG. 11, the cross sectional area s of the gas flow way can be represented by $s = 2\pi r h$. The cross sectional area of the flow way increases as a linear function as r increases. This means the mean flow velocity of the flow way decreases as r increases. With the gas delivery guide 44 of FIG. 11, the boundary layer gradually becomes larger toward the outer edge of the substrate. The nonuniform film thickness distribution arises as a result of this fact.

As shown in FIG. 3, with the gas delivery guide 44 of FIG. 1, the distance from the substrate 20 becomes smaller toward the outer edge of the substrate. In comparison with the shower head of the CVD apparatus as shown in FIG. 11, the cross sectional area of the gas flow way becomes smaller toward the outer edge of the substrate and so a boundary layer 401 of more uniform thickness is formed. The amount of precursor delivered via the boundary layer 401 becomes uniform over the whole of the substrate surface.

The gas delivery guide 44 which has a shape where the opposing surface 44 includes a circular conical form on the same axis as the center of the substrate 20 also improves the thickness distribution of the boundary layer in the circumferential direction on the same axis as the center of the substrate 20. When compared with the second and third embodiments described hereinafter, the gas delivery guide 44 which has a shape which includes a simple circular conical shape can be produced easily by means of a cutting process.

As shown in FIG. 3, the size of the opposing surface 444 of the gas delivery guide 44 is larger than the surface of the substrate 20. It can be optimized in such a way that the thickness distribution of the boundary layer as described above is constant up to the outer edge of the substrate 20.

In cases where the size of the opposing surface 444 is smaller than the surface of the substrate 20 it is impossible to adjust the thickness of the boundary layer on the surface parts of the substrate 20 which protrude beyond the opposing surface 444. In those cases where they are of the same size as well it is difficult to control the thickness of the boundary layer close to the outer edges of the substrate 20 because of the turbulence in the source gas which is produced at the edge of the opposing surface 444. In practical terms, in the case of the CVD apparatus of FIG. 1, the radius of the opposing surface 444 is preferably set at least 2 mm larger than the radius of the substrate 20.

The size of the gas delivery port (radius $r_o$) is preferably of the order of from 1/30 to 1/3 of the size or the substrate (radius W). If $r_o$ is less than 1/30 of W, then the conductance by the gas delivery port 443 is reduced and the vaporization efficiency of the vaporizer 42 may be reduced in the same way as in the case of the gas discharge holes 430 of the conventional apparatus shown in FIG. 10, and problems may arise with the occurrence of liquefication of the source gas in the gas delivery port 443. If $r_o$ is more than 1/3 of W then there is a risk that the optimizing effect on the boundary layer as outlined above will not be achieved satisfactorily. In practical terms, in those cases where the substrate 20 is an 8 inch semiconductor wafer, $r_o$ is preferably set to 15 to 25 mm.

As is clear from FIG. 1, the gas delivery guide 44 is close to the substrate holder 2. Hence heat is transmitted from the substrate holder 2 and the temperature is liable to rise. If the temperature of the gas delivery guide 44 rises above a certain level then chemical reactions will occur at the surface of the gas delivery guide as well and a thin film will inevitably tend to accumulate. The accumulation of a thin film on the gas delivery guide 44 wastefully consumes source gas and reduces productivity and, moreover, it leads to problems with the peeling of the accumulated thin film and the formation of dust particles. A temperature controlling mechanism 45 which controls the temperature of the gas delivery guide 44 to the set temperature is established in this embodiment. The temperature controlling mechanism 45 is constructed with a temperature controlling block 451 which is established in contact with the reverse side of the gas delivery guide 44, a cooling medium circulator 452 with which a cooling medium is circulated through the temperature controlling block 451, a temperature sensor 453 which detects the temperature of the gas delivery guide 44, and a control part 454 which controls the cooling medium circulator 452 in accordance with the signal from the temperature sensor 453.

The temperature controlling block 451, which is made of a material which has good thermal conductivity such as copper, is established in close contact by welding on the reverse surface of the gas delivery guide 44. The cooling medium flow way 455 through which the cooling medium is circulated is formed within the temperature controlling block 451. The cooling medium such as cold water from the cooling medium circulator 452 is circulated through this cooling medium flow way 455 so that the temperature controlling block 451 is cooled.

The control part 454 controls the cooling medium circulator 452 in accordance with a signal from the temperature sensor 453 and the temperature of the gas delivery guide 44 is controlled to the set temperature or below. The accumulation of a thin film on the surface of the gas delivery guide 44 is inhibited by this control.

If the temperature of the gas delivery guide 44 falls too far then there is a risk that the source gas will liquify on the opposing surface 444. Hence, the temperature of the gas delivery guide 44 is preferably maintained within the temperature range where chemical reaction does not occur and there is no liquefaction of the source gas. Temperature control is generally carried out with the conjoint use of the heater 447. Moreover, the construction may also be such that a cooling medium flow way is established within the gas delivery guide 44 and the cooling medium is circulated within this flow way. Furthermore, in those cases where the gas delivery guide 44 is made of quartz, a construction in which the interior is hollow and the cooling medium is passed through the inside is preferably adopted.

The operation of the CVD apparatus of the embodiment described above as a whole is described below.

The substrate 20 is transferred into the reactor 1 via a gate valve which is not shown in the drawing and is mounted and held (clamped) on the surface of the substrate holder 2. At this time the heater 3 is pre-operated and the substrate holder 2 is heated. The substrate 20 is heated to a temperature within the range of about 150° C. to 250° C. by being mounted on the substrate holder 2. The pumping system 11 is operated and, after evacuation of the reactor 1 until the pressure reaches about $1\times10^{-2}$ Pa, the source gas delivery system 4 is operated and source gas is supplied to the substrate 20.

In those cases where an auxiliary chamber such as a load lock chamber is provided in the reactor 1, the substrate 20 is transferred from the auxiliary chamber into the reactor 1 after evacuation until the pressure is of the same order in both the auxiliary chamber and the reactor 1. The gate valve is then closed and the source gas is delivered.

The source gas undergoes a series of chemical reactions on, or in the vicinity of, the surface of the substrate 20 and a thin film accumulates on this surface under an operation pressure of 0.1 to 40 Torr. At this time the thickness distribution of the boundary layer which is formed is uniform, as described earlier, and so a thin film of uniform film thickness distribution, and of uniform film quality, is formed. Moreover, the series of chemical reactions on, or in the vicinity of, the surface of the substrate is a general concept which encompasses cases where chemical reaction takes place positively on the surface of the substrate, cases where chemical reaction occurs in a space which is separated from the surface, and cases where chemical reaction occurs below the surface within the substrate.

With the CVD apparatus of this embodiment the disadvantages of the CVD apparatus of FIG. 11 which has been investigated are overcome and more uniform film deposition can be achieved. Thus, guide 44 with which the source gas is delivered from a single gas delivery port 443 is used rather than a shower head 43 like that of the conventional CVD apparatus shown in FIG. 10 and so it is possible to prevent a rise in pressure in the gas delivery port 443. Consequently, any increase in the pressure within the vaporizer 42 is suppressed and the vaporization efficiency of the vaporizer 42 can be maintained at a high level. Furthermore, the problems such as liquefaction of the source gas and blockage as seen with the gas discharge holes 430 of a shower head 43 are also substantially reduced or eliminated.

In those cases where a thin film of copper is to be deposited as a wiring material using the above mentioned Cu(hfac)(tmvs), a thin copper film can be deposited at a deposition rate of some 400 angstroms per minute if the Cu(hfac)(tmvs) is delivered to the substrate 20 at a flow rate of 0.3 grams per minute and the substrate 20 is set to a temperature of 170° C. The thin copper can be formed at the deposition rate of about 1,000 Angstroms per minute if the Cu(hfac)(tmvs) is delivered to the substrate 20 at the flow rate of 0.6 grams per minute and the substrate 20 is set to the temperature of 200° C.

Figure 4:
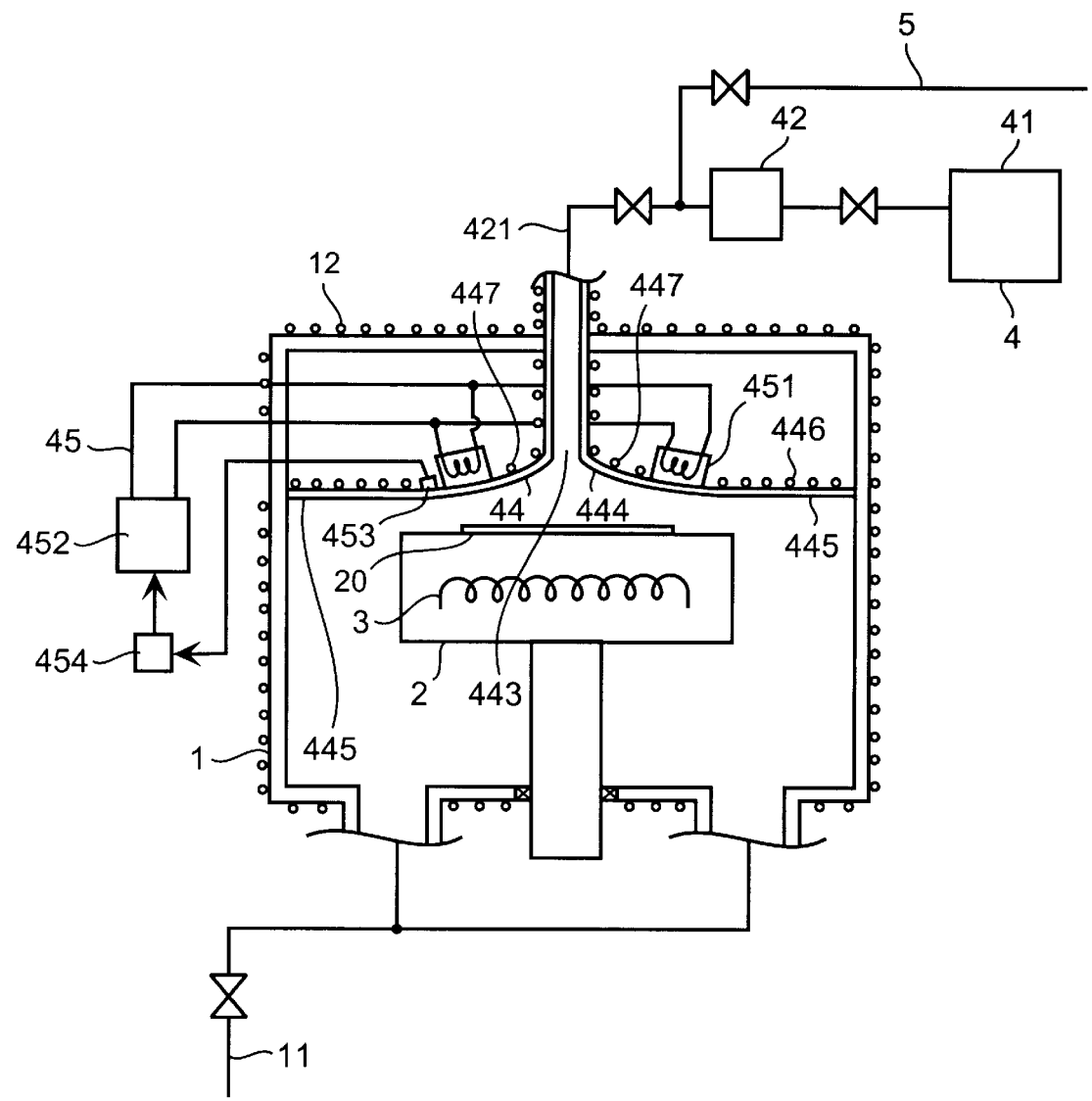
FIG. 4 is a front outline view which shows a second embodiment of chemical vapor deposition apparatus of this application.
Figure 5:
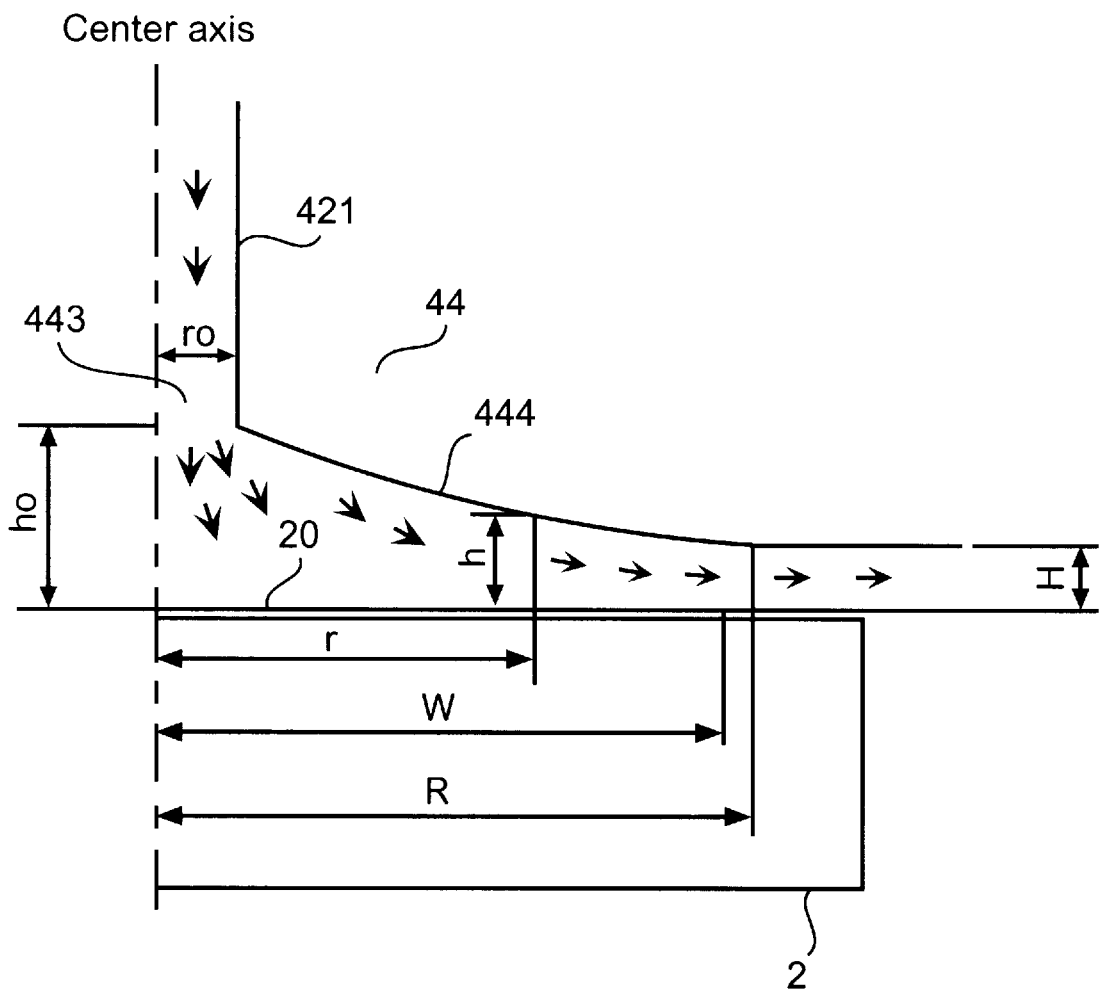
FIG. 5 is a diagram which shows the flow of source gas in the gas delivery guide shown in FIG. 4.

A second embodiment of chemical vapor deposition apparatus of the invention of this application is described below. FIG. 4 is a front outline view which shows a second embodiment of a chemical vapor deposition apparatus of the invention of this application. FIG. 5 is a diagram which shows the flow of source gas in the gas delivery guide 44 shown in FIG. 4.

This second embodiment of CVD apparatus is the same as the first embodiment except for the gas delivery guide 44. The opposing surface 444 of this gas delivery guide 44 is a hyperboloid of revolution obtained by rotating about a rotation axis on the same axis as the center of the substrate 20, a hyperbola where, when the distance from the center axis of any point on the surface is r and the distance from the substrate 20 at this point is h, the product of r and h is constant irrespective of the size of r.

This second embodiment is such that the thickness distribution of the boundary layer may be even more uniform than in the first embodiment. This is explained in detail below with reference to FIG. 5.

As has been described above, the thickness of the boundary layer depends on the flow rate in the laminar gas flow region, and the flow rate depends on the size of the flow way. In each embodiment where the gas is made to flow in from the central gas delivery port 443 and disperses (diverges) and flows toward the outer edge along the surface of the substrate 20, the size of the flow way is determined by the shape of the cylindrical surface around the center axis.

The size, i.e., the cross sectional area, of the flow way with such a circular cylindrical surface is $2\pi rh$, where the distance from the central axis of any point on the opposing surface 444 is r and the distance from the substrate 20 at this point is h, as shown in FIG. 5. Hence, if the value of $2\pi rh$ is constant irrespective of the size of r and $2h > \delta$, the size of the flow way for the dispersed gas is generally constant, and the thickness distribution of the boundary layer becomes more uniform.

If $2\pi rh$ is constant, rh must be constant so that rh describes a hyperbola. Thus, the opposing surface 444 is the hyperboloid of revolution obtained by rotating this hyperbola about a rotation axis which is the same axis as the center of the substrate 20.

In this way, the thickness distribution of the boundary layer is made more uniform in the second embodiment and so the uniformity of the film thickness distribution can also be further increased.

Figure 6:
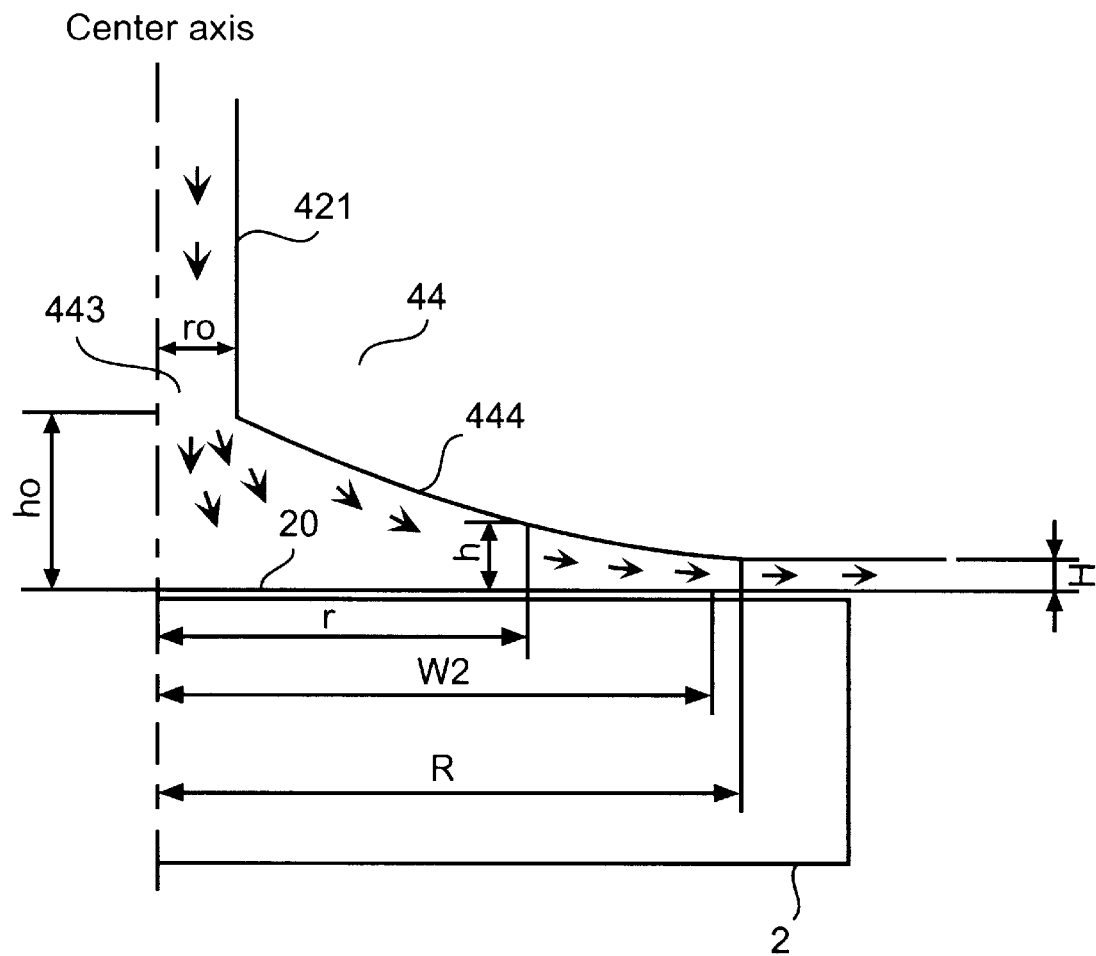
FIG. 6 is a diagram which shows the flow of source gas in the gas delivery guide of a third embodiment of chemical vapor deposition apparatus of the invention of this application.

Next, a third embodiment of the invention of this application will be described. FIG. 6 is a diagram which shows the flow of the source gas in the gas delivery guide 44 in a third embodiment of the chemical vapor deposition apparatus of the invention of this application.

The apparatus of this third embodiment is again the same as the first embodiment except for the gas delivery guide 44. The gas delivery guide 44 of this third embodiment is such that the opposing surface 444 is the curved surface of rotation obtained by rotating about a center axis which is the same axis as the center of the substrate 20, a curve where, when the distance from the center axis of any point on the surface is r and the distance from the substrate 20 at this point is h, the product of r and h becomes smaller as r increases.

The fact that the product of r and h becomes smaller as r increases signifies that $2\pi rh$ as mentioned earlier gradually becomes smaller toward the outer edge. In this third embodiment the thickness of the boundary layer gradually becomes thinner toward the outer edge. As a result, the consumption of source gas appears to increase toward the outer edge.

The source gas delivered from the gas delivery port 443 flows from the center to the outer edge part along the surface of the substrate 20. In the course of this flow, the precursor of the source gas undergoes a chemical reaction and a thin film is accumulated. Hence, since the source gas flows toward the outer edge while the precursor is being consumed, the precursor content of the source gas is somewhat lower in the outer parts than it is at the center of the substrate 20.

In consideration of this point, in this embodiment the thickness distribution of the boundary layer becomes gradually thinner towards the outer edge. If the thickness distribution of the boundary layer becomes thinner, then the distance over which the precursor is diffused to reach the substrate 20 gradually becomes shorter and so the delivery efficiency of precursor to the surface is gradually increased. The reduction in the precursor content is compensated for and the delivery rate of the precursor is made uniform, resulting in a highly uniform film thickness distribution.

Figure 7:
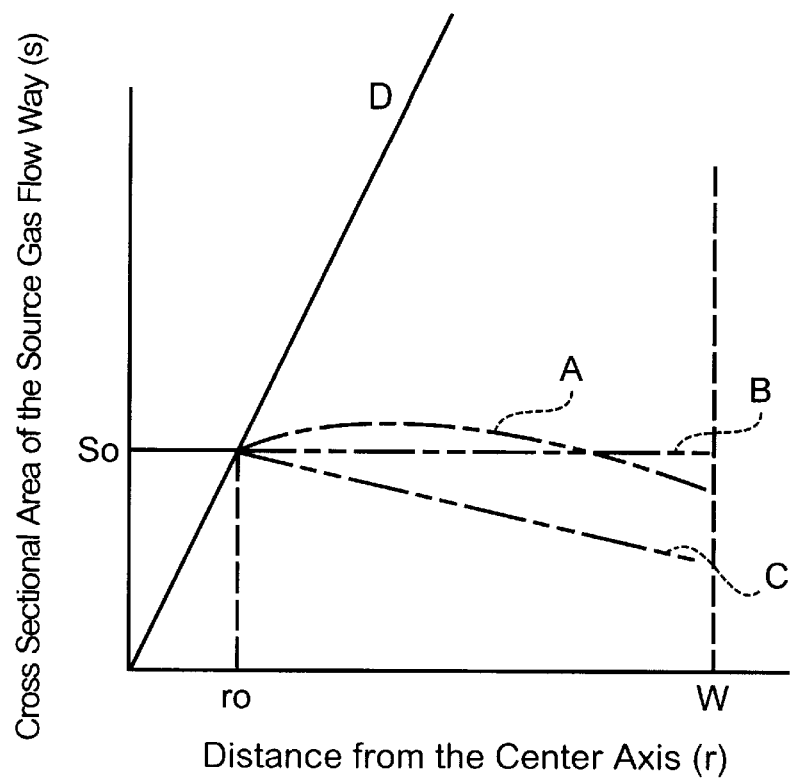
FIG. 7 is a graph which shows the relationship of the cross sectional area of the source gas flow way with respect to the distance from the center axis on the gas delivery guide.

FIG. 7 is a drawing which shows the relationship of the cross sectional area of the source gas flow way s with respect to the distance r from the center axis for each gas delivery guide 44. Here the abscissa shows the distance r from the center axis of the substrate 20 and the ordinate shows the cross sectional area s of the source gas flow way.

In FIG. 7, the single dotted chain line A shows the distribution of the cross sectional area when the gas delivery guide 44 of the first embodiment was used, the double dotted chain line B shows the distribution of the cross sectional area when the gas delivery guide 44 of the second embodiment was used, the triple dotted chain line C shows the distribution of the cross sectional area when the gas delivery guide 44 of the third embodiment was used, and the solid line D shows the distribution of the cross sectional area when the gas delivery guide 44 of the example shown in FIG. 11 was used. Moreover, $S_o$ is the cross sectional area $(r_o \times h_o)$ of the flow way at the edge of the gas delivery port 443.

With the gas delivery guide 44 of the first embodiment, the cross sectional area s of the gas flow way (the single dotted chain line A) has not been described in detail, but it is described by an upwardly convex parabola with a maximum value at the position $r = (h_o + ar_o)/2a$ (where a is a constant of proportion). In this case, the parabola becomes flatter as the angle subtended between the opposing surface 444 and the surface of the substrate 20 becomes smaller and it can be seen to be almost the same as the second embodiment which is shown by the double dotted chain line B.

As describer earlier, the thickness of the boundary layer depends on the size of the cross sectional area and so the distribution of the boundary layer in each embodiment also corresponds with the respective curve in FIG. 7. In the first and second embodiments of the present invention the thickness distribution of the boundary layer is more or less constant, and in the third embodiment it gradually becomes smaller along the flow of gas.

Figure 8:
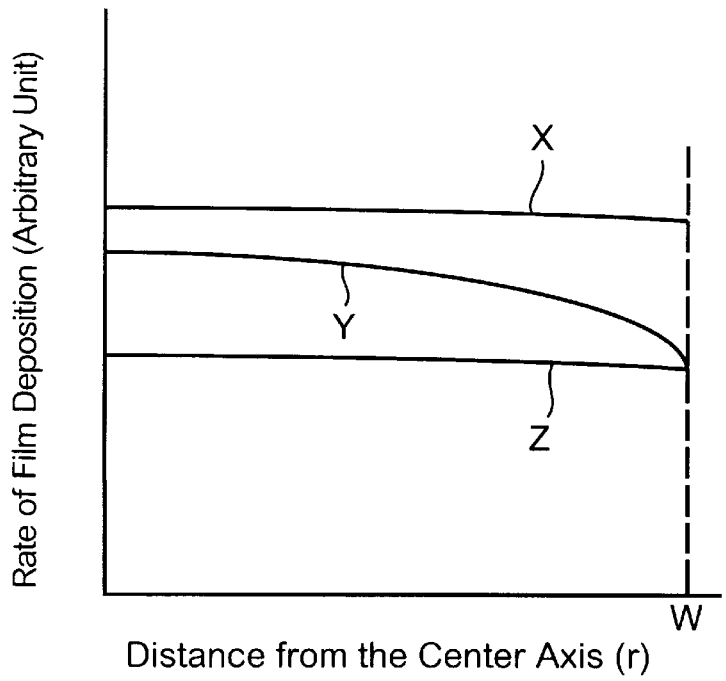
FIG. 8 is a drawing which shows the dependance of the deposition rate on the distance from the center axis in the gas delivery guide.

FIG. 8 is a drawing which shows the dependence of the deposition rate on the distance from the center axis. The abscissa of the graph shown in FIG. 8 is the distance r from the center axis, and the ordinate is the deposition rate (arbitrary units). The line X shows comprehensively the deposition rate with the gas delivery guides 44 of each of the embodiments, the line Y shows the distribution of the deposition rate with the example of FIG. 11, and the line Z shows the distribution of the deposition rate with the conventional apparatus of FIG. 10.

Figure 10:
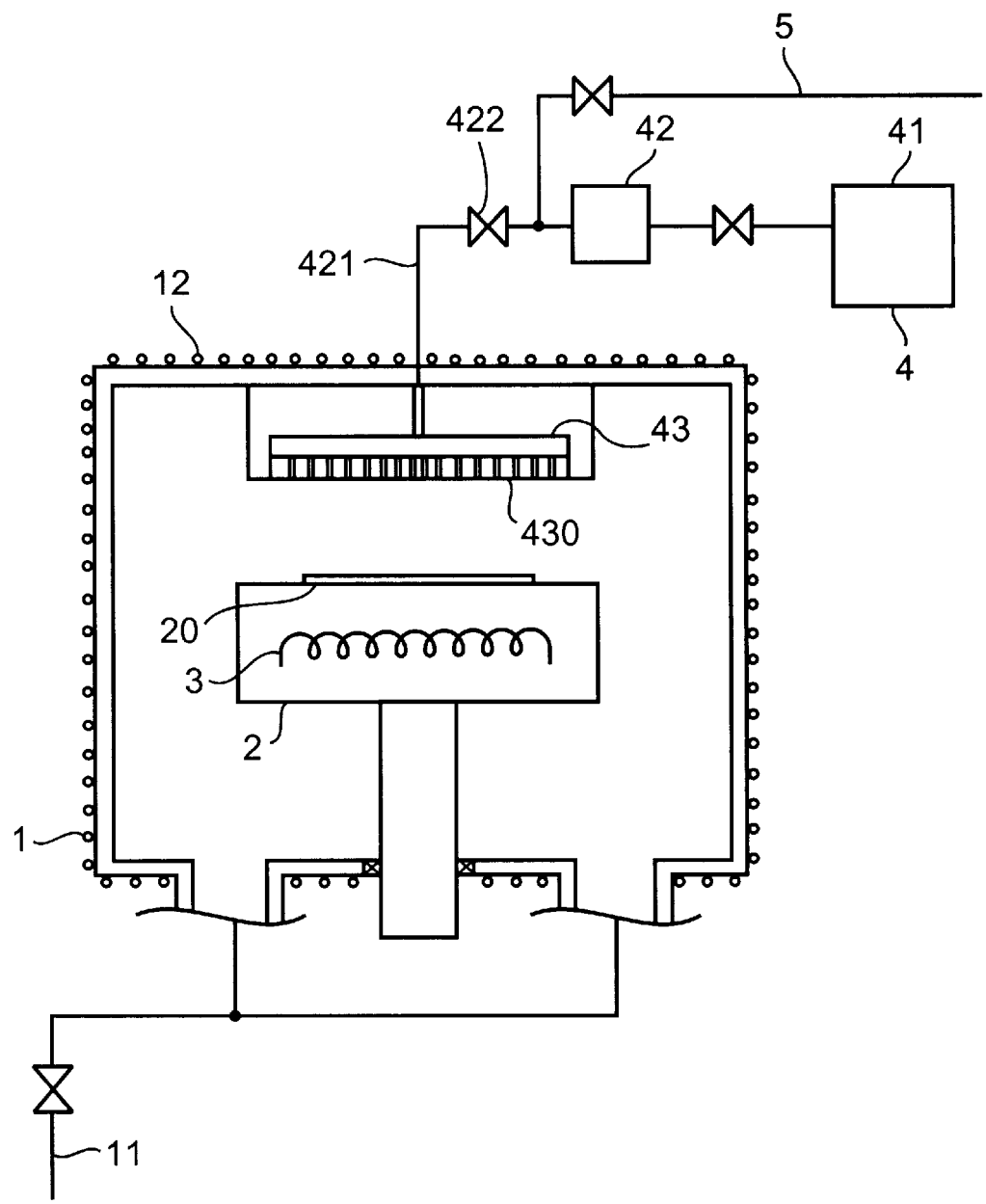
FIG. 10 is a front outline view which shows conventional chemical vapor deposition apparatus.

As is clear from FIG. 8, with the apparatus of each embodiment there is a marked improvement in terms of the uniformity of the deposition rate with respect to that of the apparatus of FIG. 11, and there is a marked improvement in respect of the increase in the deposition rate when compared with the conventional apparatus of FIG. 10.

Another example of a gas delivery guide of an invention of this application is described below.

Figure 9A:
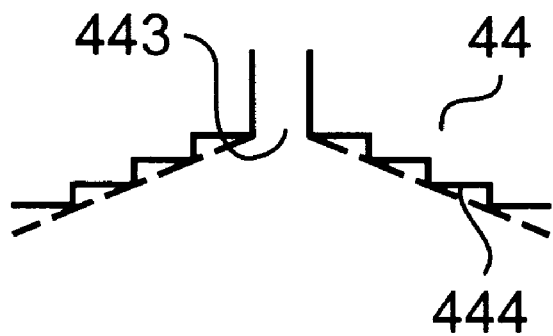
FIG. 9A is a front cross sectional outline view which shows another gas delivery guide.
Figure 9B:
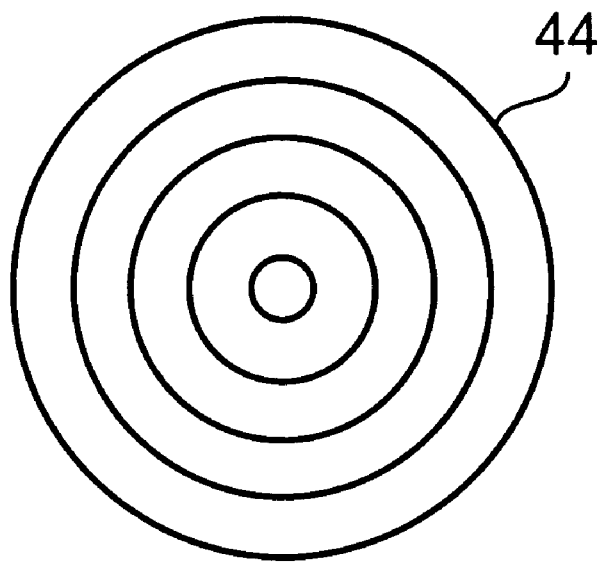
FIG. 9B is a plan view seen from below of this other gas delivery guide.

FIG. 9 is an outline drawing which shows another gas delivery guide 44. FIG. 9-1 is a front cross sectional outline view and FIG. 9-2 is a plan view as seen from below. The gas delivery guide 44 shown in FIG. 9 has a shape such that the distance from the substrate 20 becomes smaller in steps from the edge of the gas delivery port 443 to the outer edge. When a gas delivery guide 44 of this type is used, depending on the particular case, the thickness distribution of the boundary layer proceeds toward the outer edge in steps.

In the case of the gas delivery guide 44 shown in FIG. 9, the lines obtained by connecting the corners of each of the steps (shown by the dotted lines in the drawing) are ideally straight lines as in FIG. 1 or a curves as shown in FIG. 5 or FIG. 6. In a case where narrowing occurs in steps in this way, the effect is weakened if the length in the radial direction of a single step is too long. The length in the radial direction of a single step is preferably not more than 1/5th of the radius of the substrate 20. Furthermore, the steps should preferably be saw shaped.

Illustrative examples of the gas delivery guides 44 in the first, second and third embodiments mentioned above are described below.

As an example of the first embodiment when the substrate 20 is an 8 inch wafer, in accordance with FIG. 3, the radius $r_o$ of the gas delivery port 443 is preferably 25 mm, the height $h_o$ of the edge of the gas delivery port 443 is preferably 40 mm, the maximum radius R of the opposing surface 444 is preferably 105 mm, and the height H at the maximum radius R is preferably 9 mm.

An illustrative example of the second embodiment is described below, in accordance with FIG. 5. In the case where the substrate 20 is an 8 inch wafer, the opposing surface 444 is the hyperboloid of revolution by rotating about a rotation axis, the same axis as the center of the substrate 20, the hyperbola $rh=r_o h_o$. Moreover $r_o$ is preferably 25 mm, $h_o$ is preferably 40 mm, R is preferably 105 mm and H is preferably 9.5 mm.

Next, the illustrative example of the third embodiment is described below, in accordance with FIG. 6. In the case where the substrate 20 is an 8 inch wafer, the opposing surface 444 is a curved surface of revolution obtained by rotating about a rotation axis, the same axis as the center of the substrate 20 the curve $(r-120)^2+(h-152.41)^2=148.18^2$. Moreover $r_o$ is preferably 25 mm, $h_o$ is preferably 40 mm, R is preferably 105 mm and H is preferably 6 mm.

As described above, in the present invention, the thickness distribution of the boundary layer on the substrate in a flow of source gas is more or less constant or gradually becomes thinner in the direction of the flow so that the uniformity of the film thickness distribution is improved.

A gas delivery guide which has a shape such that the distance from the substrate becomes smaller, either gradually or in steps, from the edge of the gas delivery port to the outer edge of the substrate may be used, and the thickness distribution of the boundary layer is more or constant or becomes thinner in the direction of the flow.

The surface of the gas delivery guide which faces the substrate preferably has a shape which is part of an inclined surface of a circular cone on the same axis as the center of the substrate, so the thickness of the boundary layer in the circumferential direction is also improved. Moreover, the effect that the production of the gas delivery guide is comparatively simple is obtained.

The surface of the gas delivery guide which faces the substrate is preferably a hyperboloid or revolution obtained by rotating about a center axis the hyperbola where, when the distance from the center axis of said surface is r and the distance from the substrate of said surface is h, the product of r and h is more or less constant irrespective of the size of r, and so the cross sectional area of the flow way for the source gas is constant. Hence, the thickness distribution of the boundary layer is substantially constant. Moreover, the boundary layer thickness distribution in the circumferential direction is also improved.

The surface of the gas delivery guide which faces the substrate is a curved surface of revolution obtained by rotating about a center axis the curve where, when the distance from said the center axis of said surface is r and the distance between the substrate and said surface is h, the product of r and h becomes smaller as r increases, and so the cross sectional area of the flow way for the source gas gradually becomes smaller in the direction of flow of the gas. As a result, the fall in the precursor content which accompanies consumption of the source gas is compensated. Moreover, the boundary layer thickness distribution in the circumferential direction is also improved.

The size of the opposing surface of the gas delivery guide is larger than the surface of the substrate and so the formation of an eddy at the edge of the opposing surface is reduced.

A temperature control mechanism is established on the gas delivery guide and so the problem of peeling and shedding of a film accumulated on the surface of the gas delivery guide is suppressed.

The chemical vapor deposition apparatus is provided with a vaporizer and so there is no problem with the pressure in the vaporizer being inevitably increased as is the case where a shower head is used. The source gas delivery efficiency is increased and this can contribute to improved productivity.

Although only preferred embodiments are specifically illustrated and described herein, it will be appreciated that many modifications and variations of the present invention are possible in light of the above teachings and within the purview of the appended claims without departing from the spirit and intended scope of the invention.

What is claimed is:

1. A chemical vapor deposition apparatus, comprising:

a reactor;

a substrate holder for holding a substrate in the reactor;

a gas delivery guide for delivering a source gas to the reactor;

the gas delivery guide includes a gas delivery port in a center of the gas delivery guide, and means for delivering the source gas to a surface of the substrate and for subsequently guiding the source gas along the surface of the substrate mounted on the substrate holder in a laminar flow in a direction that is substantially parallel with the surface of the substrate so that a thickness distribution of a boundary layer of the source gas formed on the surface of the substrate is substantially constant or becomes thinner gradually in a direction of flow along the surface of the substrate; and the delivering means includes an opposing surface facing the substrate with no obstructions between the substrate and the opposing surface, and the opposing surface is a curved surface of rotation obtained by rotating about a rotation axis on a same axis as the center of the gas delivery guide a curve where, when a distance from the center of the gas delivery guide is r and a distance between the opposing surface and the substrate is h, a product of r and h is substantially constant.

2. The chemical vapor deposition apparatus of claim 1, wherein the curve is a hyperbola.

3. A chemical vapor deposition apparatus, comprising:

a reactor;

a substrate holder for holding a substrate in the reactor;

a gas delivery guide for delivering a source gas to the reactor;

the gas delivery guide includes means for delivering the source gas to a surface of the substrate mounted on the substrate holder in a central portion of the surface and for subsequently guiding the source gas in a laminar flow along the surface of the substrate in a direction that is substantially parallel with the surface of the substrate so that a thickness distribution of a boundary layer of the source gas formed on the surface of the substrate is substantially constant or becomes thinner gradually in the direction of laminar flow along the surface of the substrate;

the gas delivery guide has an opposing surface facing the substrate and a shape such that a direct distance between the gas delivery guide opposing surface and the substrate becomes smaller from the gas delivery port to an outer edge of the gas delivery guide; and wherein the opposing surface of the gas delivery guide which faces the substrate is a hyperboloid of revolution obtained by rotating about a center axis a hyperbola where, when the distance from the center axis on said opposing surface is r and the distance between said opposing surface and the substrate is h, the product of r and h is substantially constant.

4. The chemical vapor deposition apparatus of claim 3, wherein:
   the gas delivery guide includes a gas delivery port in a center of the gas delivery guide; and
   a center axis of the gas delivery port is on a same axis as a center of the substrate mounted on the substrate holder.

5. The chemical vapor deposition apparatus of claim 4, further comprising a temperature controlling mechanism on the gas delivery guide for preventing thin film accumulation on the gas delivery guide surface.

6. The chemical vapor deposition apparatus of claim 4, wherein a size of the opposing surface of the gas delivery guide which faces the substrate is greater than a size of a surface of the substrate.

7. The chemical vapor deposition apparatus of claim 3, further comprising a vaporizer which vaporizes a precursor when the source gas delivery system uses a precursor which is a liquid at normal temperature and pressure.

* * * * *